(12) United States Patent
Greverie

(10) Patent No.: US 6,421,533 B1
(45) Date of Patent: Jul. 16, 2002

(54) METHOD AND APPARATUS FOR CONTROLLING THE ENVELOPE OF A RADIO SIGNAL

(75) Inventor: Franck Greverie, Paris (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/122,796

(22) Filed: Jul. 27, 1998

(30) Foreign Application Priority Data

Jul. 31, 1997 (FR) .............................. 97 09787

(51) Int. Cl.$^7$ .......................... H04B 1/04; H04B 25/03; H03G 3/20
(52) U.S. Cl. .................. 455/126; 455/123; 455/125; 455/127; 375/296; 375/297; 330/129
(58) Field of Search .................. 455/126–127, 455/115–116, 522, 561; 375/296–297; 330/129, 279, 285

(56) References Cited

U.S. PATENT DOCUMENTS 5,115,203 A * 5/1992 Krett et al. ............... 330/251
5,412,341 A   5/1995 Walczak ..................... 330/138
5,621,763 A   4/1997 Walczak et al. ............ 375/312
6,020,787 A * 2/2000 Kim et al. .................. 330/279

FOREIGN PATENT DOCUMENTS

EP       0546693 A1   6/1993   ............ H03G/3/20

* cited by examiner

Primary Examiner—Daniel Hunter
Assistant Examiner—Meless Zewdu
(74) Attorney, Agent, or Firm—Sughrue Mion, PLLC

(57) ABSTRACT

A method of controlling the envelope of a radio signal to be transmitted from a station for mobile radio communications, said radio signal being output by a field effect power amplifier. The method of the invention comprises the following steps:

tapping a control voltage applied to the power amplifier;

comparing the tapped control voltage with a predefined reference voltage; and causing said control voltage applied to the power amplifier to vary as a function of the result of the comparison.

16 Claims, 2 Drawing Sheets

METHOD AND APPARATUS FOR CONTROLLING THE ENVELOPE OF A RADIO SIGNAL

FIELD OF THE INVENTION

The present invention relates to a method of controlling the envelope of a radio signal to be transmitted from a station for mobile radio communications, and apparatus for implementing the method.

The technical field that is targeted more particularly by the invention is that of stations for mobile radio communications using a digital cellular system having time-division multiple access, of the Global System for Mobile communications (GSM) type, of the Digital Cellular System (DCS) type, or of the Personal Communication System (PCS) type.

BACKGROUND OF THE INVENTION

In such a system, the various stations, i.e. firstly the base stations, and secondly the mobile stations, such as terminals on board vehicles, and portable and handheld cellphones, interchange data which is transmitted in the form of packets or bursts. Each burst is transmitted by a station in a predetermined time slot of a given frame structure. Each burst further has a particular shape for the envelope of the radio signal, which shape presents a plateau corresponding to the payload portion of the signal to be transmitted,.e.g. the speech in code form, the plateau being preceded by a rising ramp and followed by a falling ramp corresponding to guard times which surround the payload portion of the signal.

Conventionally, a burst is formed at the transmitter of a station by using a power amplifier to amplify the power of the radio signal to be transmitted, and by controlling the envelope of the radio signal output by the power amplifier, control being achieved by applying a voltage that is variable as a function of the desired envelope shape to a control input of the amplifier. The power amplifier conventionally uses one or more field effect transistors. For example, the amplifier may be made using Metal Semiconductor Field Effect Transistors (MESFETs), or High Electron Mobility Transistors (HEMTs) or Pseudomorphic HEMTs (P-HEMTs), on an AsGa or InAsGa substrate.

FIG. 1 is a simplified diagram showing known apparatus for controlling the envelope of a radio signal for the purposes of forming a burst of given envelope, using the above-described principle.

With reference to this figure, a radio signal $E_{RF}$ coming from an input circuit (not shown) is amplified by means of a power amplifier 1, e.g. a power amplifier of the above-described type. A fraction of the power of the signal output by the power amplifier 1 is tapped by means of a directional coupler 2, and it is delivered to a servo-control loop including an envelope detector 3. Comparator means 4 for comparing a first signal $V_1$ as output by the envelope detector 3 with a reference second signal $V_{REF}$ as output by a ramp generator 5 and which is a function of the desired envelope. The signal $S_c$ output by the comparator means 4 in turn controls control means 6 which modify the control voltage $V_{dd}$ applied to the power amplifier 1 as a function of the result of the comparison.

The above-described control loop thus makes it possible to generate a burst $S_{RF}$ that has the desired envelope and that is applied to an output circuit (not shown) including a transmit antenna.

Naturally, the ramp generator 5 may be replaced by any other generator for generating a reference signal corresponding to the desired envelope, and making it possible to control the power level of a radio signal output by a power amplifier so that it corresponds to said envelope.

The drawback of the apparatus shown in FIG. 1 lies in the envelope detection principle itself.

The directional coupler 2 required to tap the radio signal at the output of the power amplifier 1 so as to detect its envelope gives rise to insertion losses after the amplifier 1. Thus, in order for the maximum power of the signal $S_{RF}$ to correspond to the requirements set by standards (typically 2 watts for a handheld GSM terminal, and 1 watt for a handheld DCS or PCS terminal, the signal output by the power amplifier must be of power higher than the power of the signal $S_{RF}$, in order to take into account the insertion losses. As a result, energy consumption is not optimized in a field in which a constant concern is to reduce energy consumption to as little as possible, in particular in battery-operated handheld terminals.

Furthermore, the station for mobile radio communications must be capable of transmitting at power levels lower than the maximum level set by standards. Thus, the envelope detector must have a broad dynamic range in order to operate correctly both at maximum power and at minimum power.

OBJECTS AND SUMMARY OF THE INVENTION

An object of the invention is to provide a method and apparatus for controlling the envelope of a radio signal without it being necessary to detect the envelope of said signal.

To this end, the invention provides a method of controlling the envelope of a radio signal to be transmitted from a station for mobile radio communications, said radio signal being output by a field effect power amplifier, said method comprising the following steps:

tapping a control voltage applied to the power amplifier;

comparing the tapped control voltage with a predefined reference voltage; and causing said control voltage applied to the power amplifier to vary as a function of the result of the comparison.

The present invention further provides apparatus for controlling the envelope of a radio signal to be transmitted from a station for mobile radio communications, said radio signal being output by a field effect power amplifier , said apparatus comprising:

means for tapping a control voltage applied to the power amplifier;

comparator means for comparing the tapped control voltage with a predefined reference voltage; and control means for causing said control voltage applied to the power amplifier to vary as a function of the result of the comparison.

The invention is the result of tests conducted by the Applicant and showing that, in the particular case of a field effect power amplifier implemented using transistors on a substrate based on AsGa, the power of the signal output by such an amplifier is a faithful image of the control voltage that is applied to it and that determines the drain bias of the amplifier AsGa transistor(s) making up the power amplifier. The invention is applicable to amplifiers of the above-described type because they are very temperature stable, and they therefore deliver the same output power for a given control voltage, regardless of temperature. Thus, it is possible to control the level of the power of the signal output by the amplifier without having to tap the signal and without having to detect its envelope. It is necessary merely to tap the amplifier control voltage and to servo-control the value of said voltage as a function of the result of the comparison between said voltage and the reference signal.

BRIEF DESCRIPTION OF THE DRAWINGS

The various advantages procured by the invention appear clearly from the following description of controlling the envelope of a radio signal of the burst type, given with reference to the accompanying figures, in which.

MORE DETAILED DESCRIPTION

To make it easier to understand the invention, FIGS. 2 and 3 use the same references for common elements already described with reference to FIG. 1.

Figure 2:
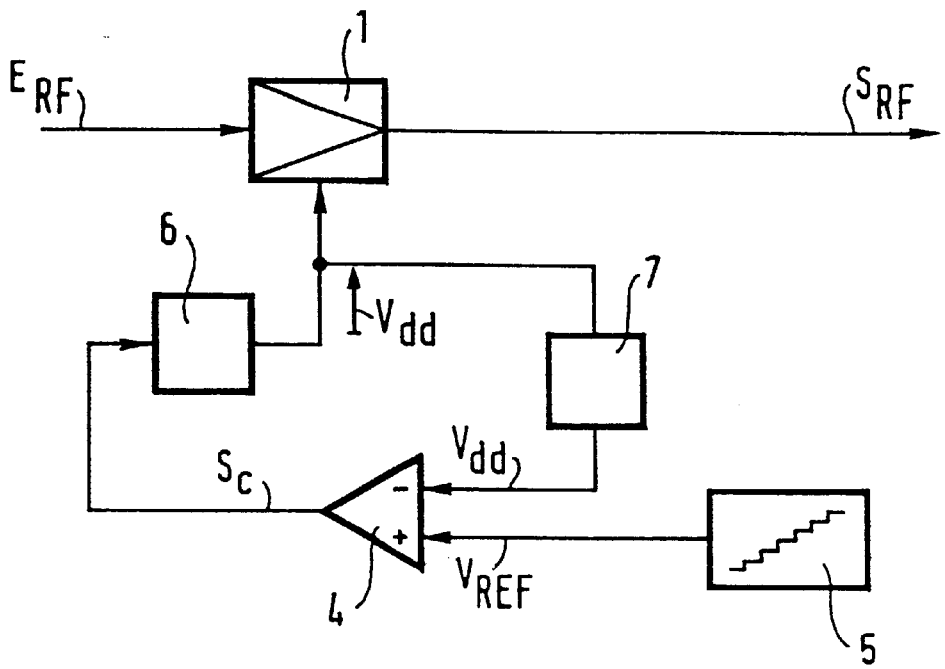
FIG. 2 is a simplified diagram showing an embodiment of an apparatus of the invention for controlling the envelope of a radio signal of the burst type.

In accordance with the present invention, and with reference to FIG. 2, the apparatus for controlling the envelope of the signal $S_{RF}$ output by a field effect power amplifier 1 made using transistors on a substrate based on AsGa includes means 7 for directly tapping the value of the control voltage $V_{dd}$ applied to the power amplifier 1. The tapped control voltage is then compared by comparator means 4 with the voltage $V_{REF}$ forming the reference signal output by a ramp generator 5. The signal $S_c$ output by the comparator means 4 controls control means 6 which cause the value of the control voltage of the amplifier 1 to vary as a function of the result of the comparison.

Figure 1:
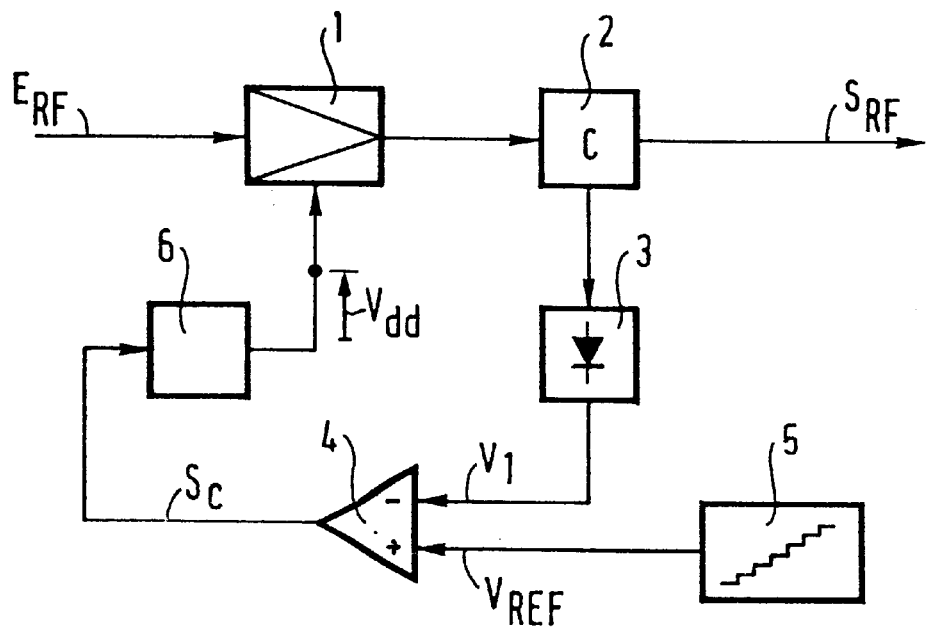
FIG. 1, described above, is a simplified diagram showing apparatus for controlling the envelope of a radio signal of the burst type using the envelope detection principle.

By comparing the diagram of FIG. 2 with the diagram of FIG. 1, it can be noted that, by means of the invention, the signal $S_{RF}$ to be transmitted to an output circuit (not shown) is output directly by the power amplifier 1. The insertion losses caused by the presence of the coupler 2 (FIG. 1) are thus eliminated. As a result, energy consumption is optimized.

Furthermore, it is no longer necessary to provide an envelope detector component having a broad dynamic range for the apparatus to operate correctly over the entire range of possible power levels.

Finally, the number of components necessary to control the envelope of the radio signal is reduced, which undeniably constitutes an advantage in terms of manufacturing cost, but also, in the particular case of handheld terminals, in terms of compactness, weight, and energy consumption.

Figure 3:
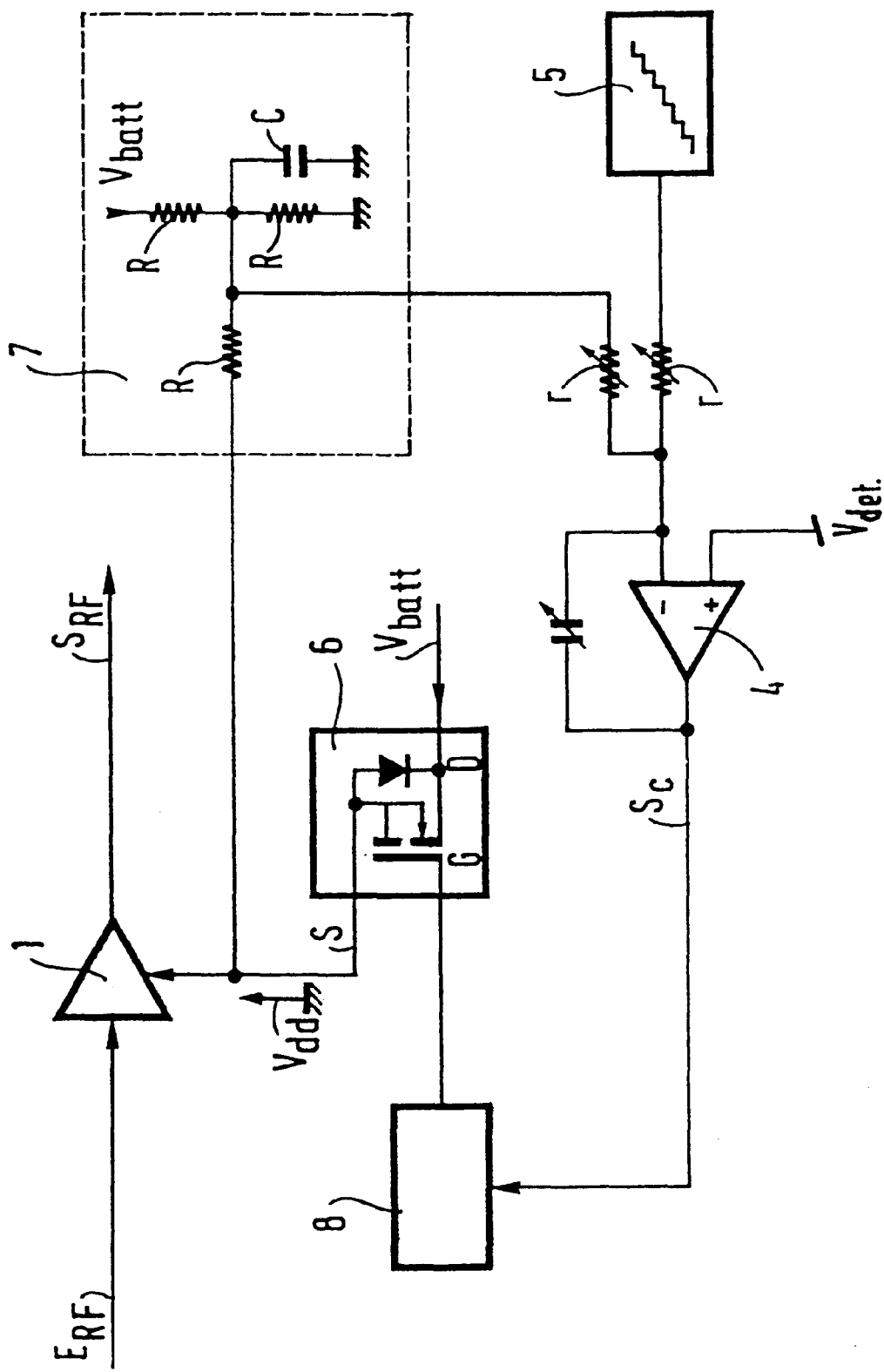
FIG. 3 shows a preferred embodiment of apparatus of the invention for controlling the envelope of a radio signal of the burst type.

FIG. 3 shows a preferred embodiment of apparatus operating using the principle described with reference to FIG. 2.

As shown in FIG. 3, the comparator means 4 comprise a differential amplifier having a first input connected to a predetermined voltage $V_{det}$, and a second input receiving, via variable-resistance resistors r, firstly the voltage forming the reference signal output by the generator 5, and secondly the signal representative of the control voltage $V_{dd}$ tapped by the means 7. The means 7 comprise a capacitor C, and resistors R connected to form a voltage-dividing bridge between a power supply voltage $V_{batt}$ and ground, the resulting assembly making it possible to match the level of the tapped control voltage as a function of the value of the predetermined voltage $V_{det}$. The control means 6 preferably comprise an N-channel MOSFET in which the gate G receives the control signal $S_c$ output by the comparator means 4, the drain D receives the power supply voltage $V_{batt}$, and the source S is connected to the control input of the power amplifier 1. Naturally, other components acting as variable-resistance resistors may be used instead of the N-channel MOSFET. A doubler 8 is preferably used between the comparator means 4 and the MOSFET 6 so as to provide at least a minimum gate voltage that is high enough relative to the power supply voltage.

Although the invention is described with reference to controlling the envelope of a particular radio signal, namely a burst signal, requiring rising ramps and falling ramps to be generated, it can be understood that the principle of the invention can be generalized to any radio signal to be transmitted from a station for mobile radio communications whenever it is necessary to control the envelope of the signal accurately.

I claim:

1. A method of controlling the envelope of a radio signal to be transmitted from a station for mobile radio communications, said radio signal being output by a field effect power amplifier, said method comprising the following steps:

tapping a control voltage applied to the power amplifier;

comparing the tapped control voltage with a predefined reference voltage; and causing said control voltage applied to the power amplifier to vary as a function of the result of the comparison, independent of any tapping of the output of the power amplifier.

2. Apparatus for controlling the envelope of a radio signal to be transmitted from a station for mobile radio communications, said radio signal being output by a field effect power amplifier, said apparatus comprising:

means for tapping a control voltage applied to the power amplifier;

comparator means for comparing the tapped control voltage with a predefined reference voltage; and control means for causing said control voltage applied to the power amplifier to vary as a function of the result of the comparison, independent of any tapping of the output of the power amplifier.

3. Apparatus according to claim 2, wherein, with said station operating using a digital cellular system having time-division multiple access, the radio signal to be transmitted has an envelope shape presenting a plateau preceded by a rising ramp and followed by a falling ramp, and the predefined reference voltage is output by a ramp generator as a function of said envelope shape.

4. Apparatus according to claim 2, wherein the control means comprise a MOSFET used as a variable-resistance resistor.

5. Apparatus according to claim 2, wherein said power amplifier is made using transistors on a substrate based on AsGa.

6. Apparatus for controlling the envelope of a radio signal to be transmitted from a station for mobile radio communications, said radio signal being output by a field effect power amplifier made using transistors on a substrate based on AsGa, said apparatus comprising:

means for tapping a control voltage applied to the power amplifier;

a comparator comprising a differential amplifier connected via a first input to a predetermined voltage, and connected via a second input to both the tapped control voltage and a predefined reference voltage; and control means for causing said control voltage applied to the power amplifier to vary as a function of the result of the comparison, independent of any tapping of the output of the power amplifier.

7. Apparatus according to claim 6, wherein the means for tapping the control voltage make it possible to match the level of the tapped control voltage as a function of the value of the predetermined voltage connected to the differential amplifier.

8. Apparatus according to claim 6, wherein said power amplifier is made using transistors on a substrate based on AsGa.

9. Apparatus for controlling the envelope of a radio signal to be transmitted from a station for mobile radio communications, said radio signal being output by a field effect power amplifier, said apparatus comprising:

a circuit operative to tap a control voltage applied to the power amplifier, said circuit outputting a tapped control voltage;

a comparator operative to compare the tapped control voltage with a predefined reference voltage, said comparator generating a result; and a controller that causes said control voltage applied to the power amplifier to vary as a function of the result of the comparison, independent of any tapping of the output of the power amplifier.

10. Apparatus according to claim 9, wherein, with said station operating using a digital cellular system having time-division multiple access, the radio signal to be transmitted has an envelope shape presenting a plateau preceded by a rising ramp and followed by a falling ramp, and the predefined reference voltage is output by a ramp generator as a function of said envelope shape.

11. Apparatus according to claim 9, wherein the control means comprise a MOSFET used as a variable-resistance resistor.

12. Apparatus according to claim 9, wherein said power amplifier is made using transistors on a substrate based on AsGa.

13. Apparatus for controlling the envelope of a radio signal to be transmitted from a station for mobile radio communications, said radio signal being output by a field effect power amplifier, said apparatus comprising:

a circuit operative to tap a control voltage applied to the power amplifier, said circuit outputting a tapped control voltage;

a comparator comprising a differential amplifier connected via a first input to a predetermined voltage, and connected via a second input to both the tapped control voltage and a predefined reference voltage, said comparator generating a result; and a controller that causes said control voltage applied to the power amplifier to vary as a function of the result of the comparison, independent of any tapping of the output of the power amplifier.

14. Apparatus according to claim 13, wherein said circuit matches the level of the tapped control voltage as a function of the value of the predetermined voltage connected to the differential amplifier.

15. Apparatus according to claim 13, wherein said power amplifier is made using transistors on a substrate based on AsGa.

16. Apparatus according to claim 11, wherein the control means comprise a MOSFET used as a variable-resistance resistor.

* * * * *